(12) United States Patent
Liao et al.

(10) Patent No.: US 11,143,692 B2
(45) Date of Patent: Oct. 12, 2021

(54) LED WAFER, LED WAFER DETECTION DEVICE, AND LED WAFER DETECTION METHOD

(71) Applicant: ASTI GLOBAL INC., TAIWAN, Taichung (TW)

(72) Inventors: Chien-Shou Liao, New Taipei (TW); Te-Fu Chang, Taichung (TW); Chun-An Lu, Pingtung County (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 0 days.

(21) Appl. No.: 16/811,036

(22) Filed: Mar. 6, 2020

(65) Prior Publication Data
US 2021/0123967 A1    Apr. 29, 2021

(30) Foreign Application Priority Data
Oct. 25, 2019    (TW) .................................. 108138616

(51) Int. Cl.
*G01R 31/26*    (2020.01)
*H01L 21/66*    (2006.01)

(52) U.S. Cl.
CPC .......... *G01R 31/2635* (2013.01); *H01L 22/34* (2013.01)

(58) Field of Classification Search
CPC .. G01R 31/2635; G01R 1/07314; H01L 22/34
See application file for complete search history.

(56) References Cited

U.S. PATENT DOCUMENTS

| | | | | |
|---|---|---|---|---|
| 2011/0267087 A1* | 11/2011 | Huang | ............... | G01R 31/2635 324/754.23 |
| 2012/0012871 A1* | 1/2012 | Hsia | .................... | H01L 33/0095 257/98 |
| 2013/0187194 A1* | 7/2013 | Wei | ........................ | H01L 33/005 257/99 |
| 2013/0323862 A1* | 12/2013 | Nonomura | .............. | H01L 22/10 438/15 |
| 2014/0077235 A1* | 3/2014 | Kwon | ..................... | H01L 24/24 257/88 |
| 2018/0340985 A1* | 11/2018 | Jung | ....................... | G01J 3/505 |
| 2018/0374829 A1* | 12/2018 | Henley | ............. | H01L 21/67132 |

* cited by examiner

*Primary Examiner* — Alvaro E Fortich

(57) ABSTRACT

An LED wafer, an LED wafer detection device and an LED wafer detection method are provided. The LED wafer includes a wafer base, a plurality of LED chips, a plurality of positive test circuit layers, a plurality negative test circuit layers, a plurality of positive test contacts, and a plurality of negative test contacts. Each LED chip has a positive contact and a negative contact respectively electrically connected to the corresponding positive test circuit layer and the corresponding negative test circuit layer. The positive test contacts are respectively electrically connected to the positive test circuit layers, and the negative test contacts are respectively electrically connected to the negative test circuit layers. Whereby, when inputting an electric current into the positive test contacts, and then outputting the electric current from the negative test contacts, each LED chip is excited to generate a light source.

10 Claims, 7 Drawing Sheets

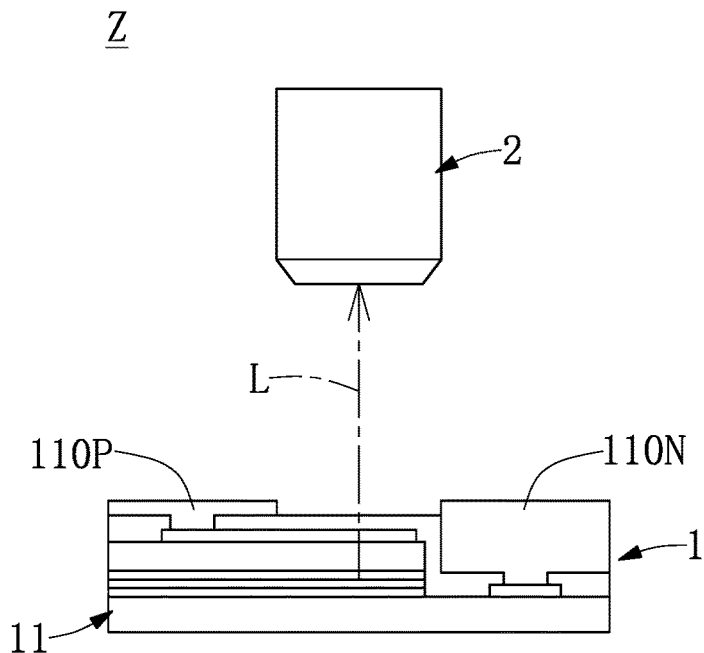

FIG. 3

| providing an LED wafer including a plurality of LED chips, a plurality of positive test circuit layers, a plurality negative test circuit layers, a plurality of positive test contacts and a plurality of negative test contacts | —S100 |

| inputting an electric current into the positive test contacts, and then outputting the electric current from the negative test contacts so as to excite each LED chip to generate a light source | —S102 |

| using a light-detecting module to optically detect the light source that is generated by each LED chip | —S104 |

FIG. 4

LED WAFER, LED WAFER DETECTION DEVICE, AND LED WAFER DETECTION METHOD

CROSS-REFERENCE TO RELATED PATENT APPLICATION

This application claims the benefit of priority to Taiwan Patent Application No. 108138616, filed on Oct. 25, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a wafer, a wafer detection device and a wafer detection method, and more particularly to an LED (light-emitting diode) wafer, an LED wafer detection device and an LED wafer detection method.

BACKGROUND OF THE DISCLOSURE

A light emitting diode (LED) is now widely used because of its excellent light quality and high luminous efficiency. Generally, in order to enhance color performance of a display device using LEDs as light emitters, a combination of red, green, and blue LED chips is used to form a full-color LED display device in the related art. The full-color LED display device can emit red, green and blue colors respectively through the red, green and blue LED chips, and then form a full-color light by mixing lights to display related information. However, the conventional LED detection device and the conventional LED detection method still need to be improved.

SUMMARY OF THE DISCLOSURE

In response to the above-referenced technical inadequacies, the present disclosure provides an LED wafer, an LED wafer detection device and an LED wafer detection method.

In one aspect, the present disclosure provides an LED wafer detection device, including an LED wafer and a light-detecting module. The LED wafer includes a wafer base, a plurality of LED chips, a plurality of positive test circuit layers, a plurality negative test circuit layers, a plurality of positive test contacts and a plurality of negative test contacts. The light-detecting module is disposed above the LED wafer. In addition, all of the LED chips, the positive test circuit layers, the negative test circuit layers, the positive test contacts and the negative test contacts are disposed on the wafer base. Moreover, each LED chip has a positive contact and a negative contact respectively electrically connected to the corresponding positive test circuit layer and the corresponding negative test circuit layer. Furthermore, the positive test contacts are respectively electrically connected to the positive test circuit layers, and the negative test contacts are respectively electrically connected to the negative test circuit layers. Whereby, when inputting an electric current into the positive test contacts, and then outputting the electric current from the negative test contacts, each LED chip is excited to generate a light source, and the light source generated by each LED chip is optically detected by the light-detecting module.

In another aspect, the present disclosure provides an LED wafer, including a wafer base, a plurality of LED chips disposed on the wafer base, a plurality of positive test circuit layers disposed on the wafer base, a plurality negative test circuit layers disposed on the wafer base, a plurality of positive test contacts disposed on the wafer base, and a plurality of negative test contacts disposed on the wafer base. In addition, each LED chip has a positive contact and a negative contact respectively electrically connected to the corresponding positive test circuit layer and the corresponding negative test circuit layer. Moreover, the positive test contacts are respectively electrically connected to the positive test circuit layers, and the negative test contacts are respectively electrically connected to the negative test circuit layers. Whereby, when inputting an electric current into the positive test contacts, and then outputting the electric current from the negative test contacts, each LED chip is excited to generate a light source.

In yet another aspect, the present disclosure provides an LED wafer detection method, including: providing an LED wafer including a plurality of LED chips, a plurality of positive test circuit layers, a plurality negative test circuit layers, a plurality of positive test contacts and a plurality of negative test contacts; inputting an electric current into the positive test contacts, and then outputting the electric current from the negative test contacts so as to excite each LED chip to generate a light source; and using a light-detecting module to optically detect the light source that is generated by each LED chip.

Therefore, by virtue of "all of the LED chips, the positive test circuit layers, the negative test circuit layers, the positive test contacts and the negative test contacts are disposed on the wafer base", "each LED chip has a positive contact and a negative contact respectively electrically connected to the corresponding positive test circuit layer and the corresponding negative test circuit layer" and "the positive test contacts are respectively electrically connected to the positive test circuit layers, and the negative test contacts are respectively electrically connected to the negative test circuit layers", when inputting an electric current into the positive test contacts, and then outputting the electric current from the negative test contacts, each LED chip can be excited to generate a light source, and the light source generated by each LED chip can be optically detected by the light-detecting module.

Furthermore, by virtue of "providing an LED wafer including a plurality of LED chips, a plurality of positive test circuit layers, a plurality negative test circuit layers, a plurality of positive test contacts and a plurality of negative test contacts" and "inputting an electric current into the positive test contacts, and then outputting the electric current from the negative test contacts so as to excite each LED chip to generate a light source", a light-detecting module can be used to optically detect the light source that is generated by each LED chip.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 3 is a lateral schematic view of an LED wafer detection device according to the first embodiment of the present disclosure.

FIG. 4 is a flowchart of an LED wafer detection method according to the first embodiment of the present disclosure.

DETAILED DESCRIPTION OF THE EXEMPLARY EMBODIMENTS

Figure 1:
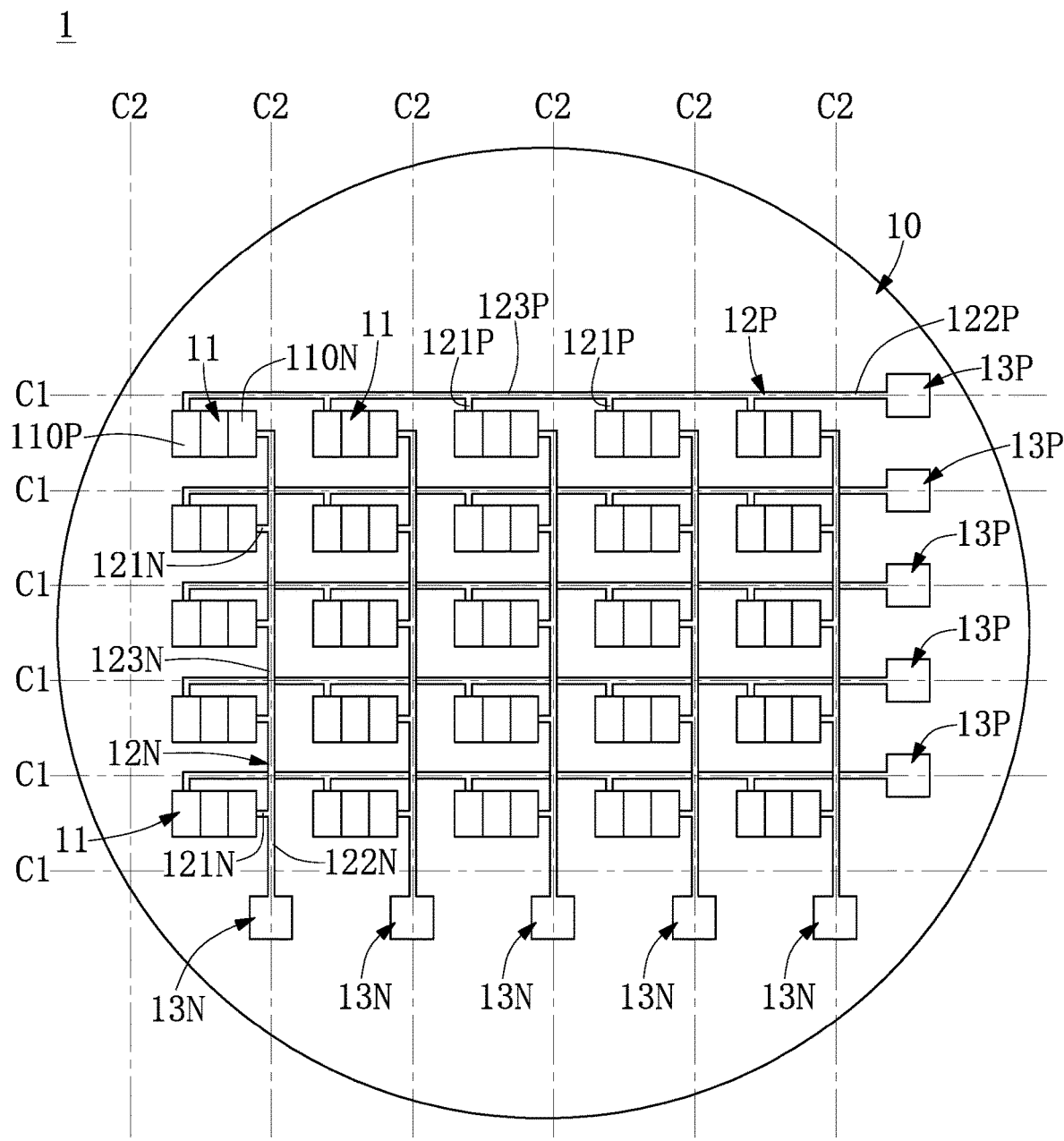
FIG. 1 is a top schematic view of an LED wafer according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 4, a first embodiment of the present disclosure provides an LED wafer detection device Z, including an LED wafer 1 and a light-detecting module 2.

Figure 2:
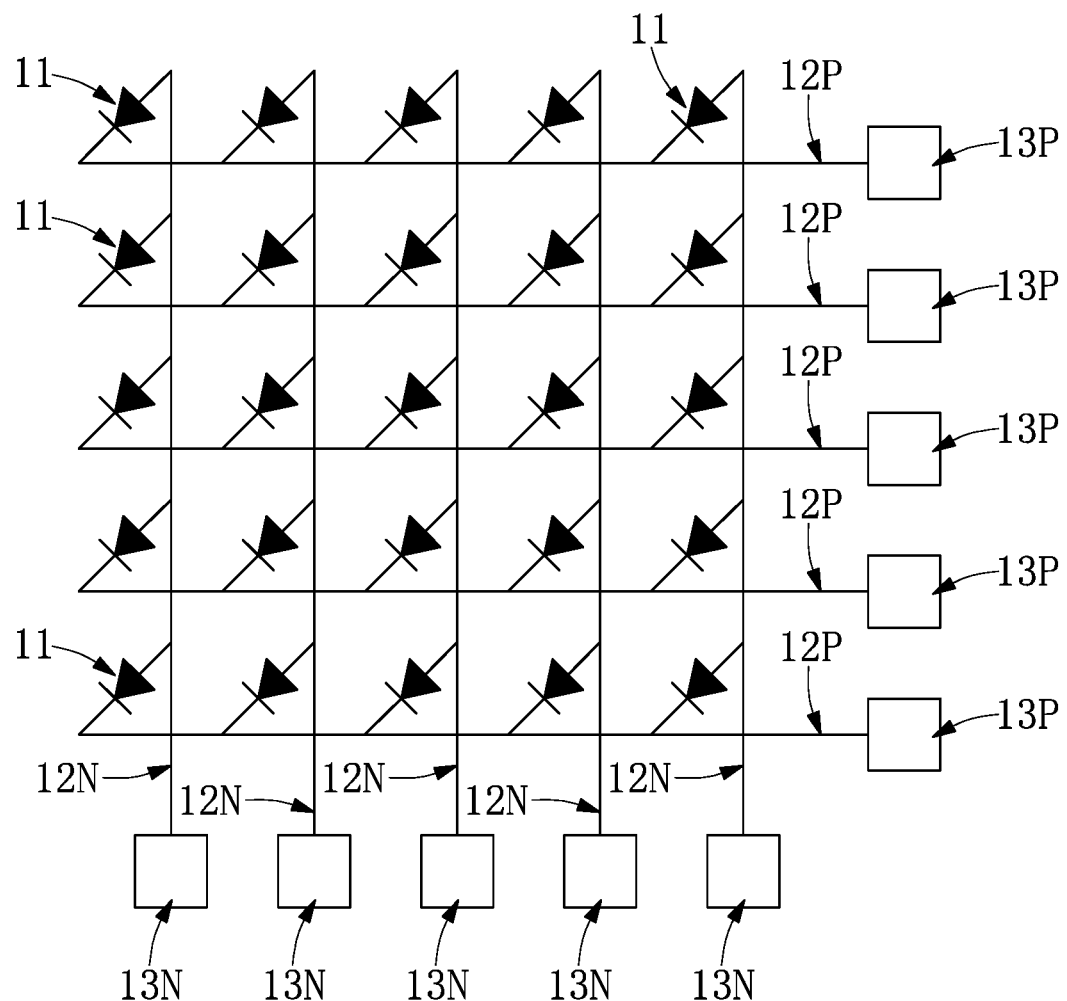
FIG. 2 is a schematic circuit diagram of the LED wafer according to the first embodiment of the present disclosure.

First, referring to FIG. 1 to FIG. 3, the LED wafer 1 includes a wafer base 10, a plurality of LED chips 11, a plurality of positive test circuit layers 12P, a plurality of negative test circuit layers 12N, a plurality of positive test contacts 13P and a plurality of negative test contacts 13N, and the light-detecting module 2 is disposed above the LED wafer 1. For example, all of the LED chips 11, the positive test circuit layers 12P, the negative test circuit layers 12N, the positive test contacts 13P and the negative test contacts 13N are disposed on the wafer base 10 by a semiconductor manufacturing process, but it is merely an example and is not meant to limit the scope of the present disclosure. In addition, each LED chip 11 has a positive contact 110P and a negative contact 110N being respectively electrically connected to the corresponding positive test circuit layer 12P and the corresponding negative test circuit layer 12N. Moreover, the positive test contacts 13P are respectively electrically connected to the positive test circuit layers 12P, and the negative test contacts 13N are respectively electrically connected to the negative test circuit layers 12N. Therefore, the positive contact 110P and the negative contact 110N of each LED chip 11 are respectively electrically connected to the corresponding positive test contacts 13P and the corresponding negative test contacts 13N by the corresponding positive test circuit layers 12P and the corresponding negative test circuit layers 12N, respectively.

Moreover, referring to FIG. 1 and FIG. 2, the positive test contacts 13P are separated from each other to respectively form a plurality of single positive test contacts that are adjacent to each other, and the negative test contacts 13N are separated from each other to respectively form a plurality of single negative test contacts that are adjacent to each other. In addition, as shown in FIG. 1, the positive test circuit layer 12P and the negative test circuit layer 12N are respectively disposed on a first horizontal plane and a second horizontal plane (that is to say, the positive test circuit layer 12P and the negative test circuit layer 12N are two different layers that do not contact each other), and the positive test contact 13P and the negative test contact 13N are respectively disposed on the first horizontal plane and the second horizontal plane (that is to say, the positive test contact 13P and the negative test contact 13N are two different layers that do not contact each other). For example, the first horizontal plane is higher than, lower than or equal to the second horizontal plane. As shown in FIG. 1, when the first horizontal plane is lower than the second horizontal plane, the position of the positive test circuit layer 12P is lower than the position of the negative test circuit layer 12N, and the position of the positive test contact 13P is lower than the position of the negative test contact 13N, but it is merely an example and is not meant to limit the scope of the present disclosure. For another example, the position of the positive test circuit layer 12P can be higher than or equal to the position of the negative test circuit layer 12N, and the position of the positive test contact 13P can be higher than or equal to the position of the negative test contact 13N.

Furthermore, as shown in FIG. 1, the positive test circuit layer 12P includes a plurality of first positive end portions 121P, a second positive end portion 122P, and a positive connection portion 123P connected between the first positive end portion 121P and the second positive end portion 122P. More particularly, the first positive end portion 121P can be electrically connected to the positive contact 110P of the corresponding LED chip 11, the second positive end portion 122P can be electrically connected to the corresponding positive test contact 13P, and the positive connection portion 123P can be extended along a first cutting path C1. In addition, the negative test circuit layer 12N includes a plurality of first negative end portions 121N, a second negative end portion 122N, and a negative connection portion 123N connected between the first negative end portion 121N and the second negative end portion 122N. More particularly, the first negative end portion 121N can be electrically connected to the negative contact 110N of the corresponding LED chip 11, the second negative end portion 122N can be electrically connected to the corresponding negative test contact 13N, and the negative connection portion 123N can be extended along a second cutting path C2. For example, a cutting width is greater than or equal to a width of the first cutting path C1 and a width of the second cutting path C2, so that when cutting the LED wafer 1 along the first cutting path C1 and the second cutting path C2, the larger part of the first cutting path C1 and the larger part of the second cutting path C2 can be removed.

In addition, referring to FIG. 1 and FIG. 3, when inputting an electric current (or an electric power) into the positive test contacts 13P, and then outputting the electric current (or the electric power) from the negative test contacts 13N, each LED chip 11 can be excited (or triggered) to generate a light source L (such as a visible spectrum or a visible light band between 450 nm and 750 nm). In other words, after the current is inputted into the positive test contacts 13P, the current can be transmitted to the LED chip 11 through the positive test circuit layer 12P, and then after the current is inputted into the positive contact 110P of the LED chip 11, the current can be outputted from the negative contact 110N of the LED chip 11 so as to excite (or to trigger) the LED chip 11 to generate the light source L, and then the current can be outputted from the negative test contacts 13N through the negative test circuit layer 12N. For example, the LED chip 11 may be a micro LED chip or a micro-semiconductor light-emitting chip that includes an n-type conductive layer, a light-emitting layer through which a laser beam passes, and a p-type conductive layer that are disposed in a stacked arrangement. The n-type conductive layer may be an n-type gallium nitride material layer or an n-type gallium arsenide material layer, the light-emitting layer may be a multi-quantum well structure layer, and the p-type conductive layer may be a p-type gallium nitride material layer or a p-type gallium arsenide material layer. For another example, the LED chip 11 may be a mini LED chip or a sub-millimeter light-emitting chip that includes a base layer, an n-type conductive layer, a light-emitting layer through which a laser beam passes, and a p-type conductive layer that are disposed in a stacked arrangement. The base layer may be a sapphire material layer, the n-type conductive layer may be an n-type gallium nitride material layer or an n-type gallium arsenide material layer, the light-emitting layer may be a multi-quantum well structure layer, and the p-type conductive layer may be a p-type gallium nitride material layer or a p-type gallium arsenide material layer. The base layer may also be a quartz base layer, a glass base layer, a tantalum base layer, or a base layer of any material. However, the aforementioned description for the LED chip 11 of the first embodiment is merely an example and is not meant to limit the scope of the present disclosure.

Moreover, referring to FIG. 1, FIG. 3 and FIG. 4, the first embodiment of the present disclosure further provides an LED wafer detection method, including: first, providing an LED wafer 1 including a plurality of LED chips 11, a plurality of positive test circuit layers 12P, a plurality of negative test circuit layers 12N, a plurality of positive test contacts 13P and a plurality of negative test contacts 13N (step S100); next, inputting an electric current (or an electric power) into the positive test contacts 13P, and then outputting the electric current (the electric power) from the negative test contacts 13N so as to excite each LED chip 11 to generate a light source L (step S102); and then using a light-detecting module 2 to optically detect the light source L that is generated by each LED chip 11 (step S104). For example, the light-detecting module 2 may be an electroluminescence spectroscopy or any kind of optical detector. In addition, the light source L generated by each LED chip 11 can be detected by the light-detecting module 2 to obtain information that at least includes a wavelength range, a brightness value, etc., so that a wavelength range and a brightness value of each wafer-grade LED chip 11 of the LED wafer 1 can be obtained indirectly and respectively due to the wavelength range and the brightness value of the information that has been obtained by detecting the light source L. However, the aforementioned description for the information of the light source L is merely an example and is not meant to limit the present disclosure. It should be noted that electroluminescence (EL) is an optical phenomenon and electrical phenomenon in which a material emits light in response to the passage of an electric current or to a strong electric field, so that each LED chip 11 can be excited to generate the light source L by the electric power.

Second Embodiment

Figure 5:
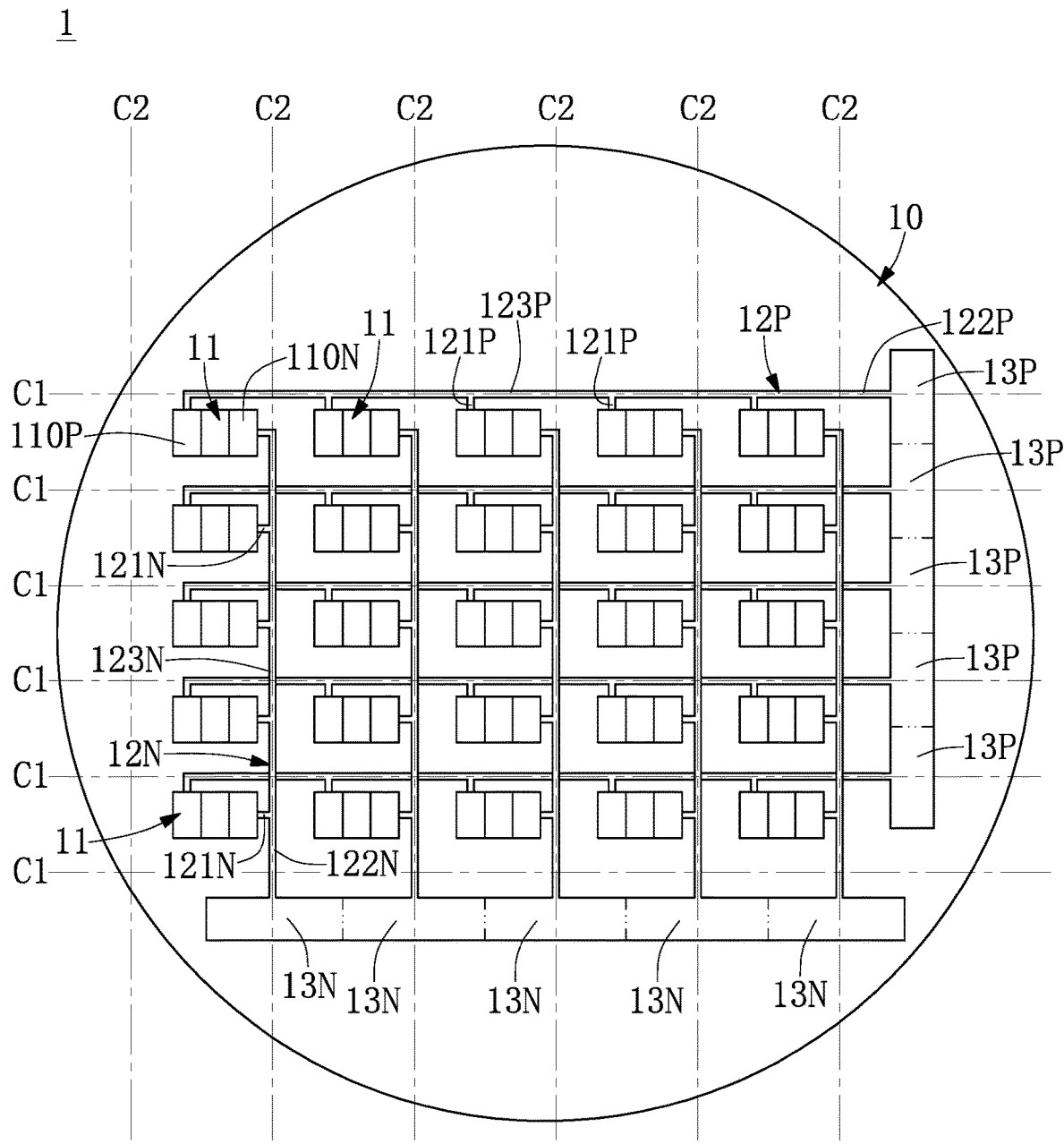
FIG. 5 is a top schematic view of an LED wafer according to a second embodiment of the present disclosure.
Figure 6:
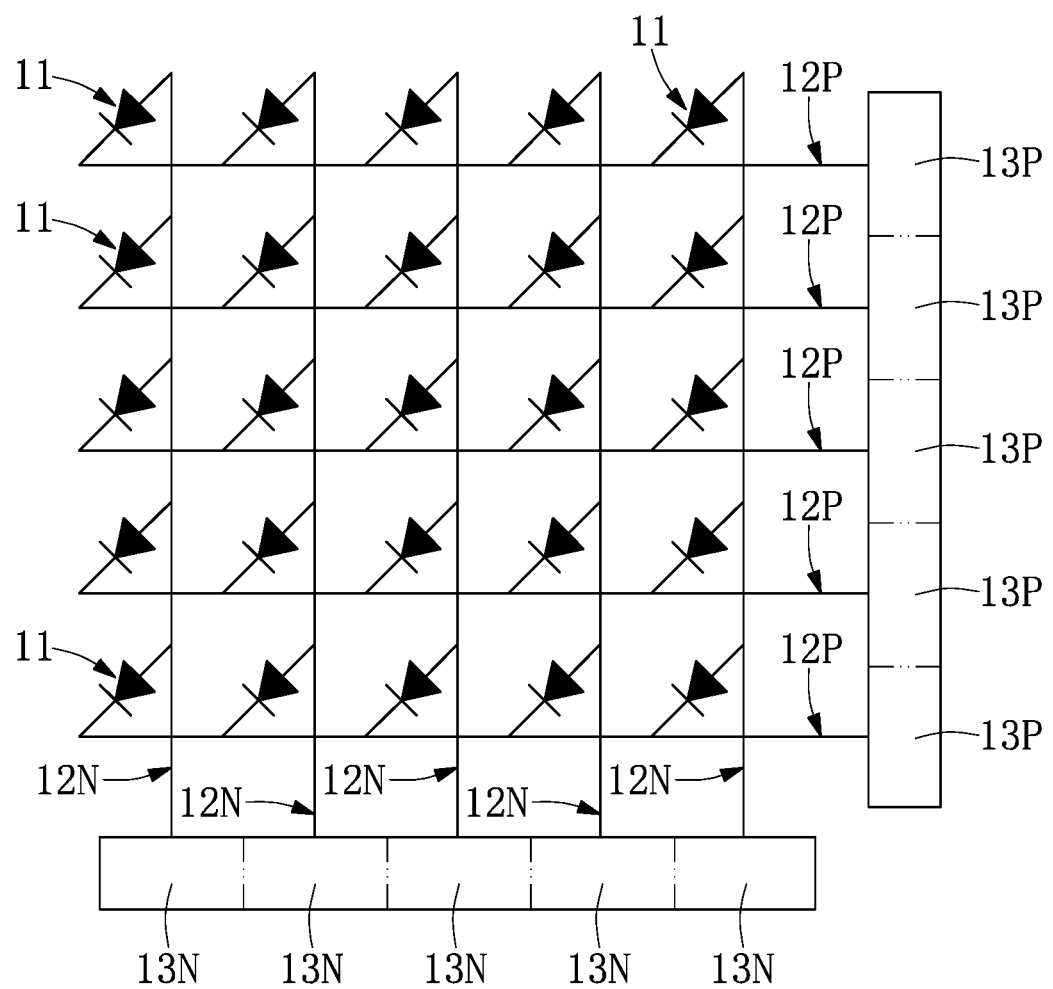
FIG. 6 is a schematic circuit diagram of the LED wafer according to the second embodiment of the present disclosure.

Referring to FIG. 5 to FIG. 6, a second embodiment of the present disclosure provides an LED wafer detection device, including an LED wafer 1 and a light-detecting module (not shown). Comparing FIG. 5 with FIG. 1, and comparing FIG. 6 with FIG. 2, the difference between the second embodiment and the first embodiment is as follows: in the second embodiment, the positive test contacts 13P are connected with each other to form a single positive test area, and the negative test contacts 13N are connected with each other to form a single negative test area. That is to say, the present disclosure (such as in the first embodiment as shown in FIG. 1 and FIG. 2) can not only detect each individual LED chip 11 of the LED wafer 1 by matching a single positive test contact (such as a positive test contact 13P) and a single negative test contact (such as a negative test contact 13N), but the present disclosure (such as in the second embodiment as shown in FIG. 5 and FIG. 6) can also detect all of the LED chips 11 of the LED wafer 1 by matching a single positive test area (such as the combination of the positive test contacts 13P) and a single negative test area (such as the combination of the negative test contact 13N).

Third Embodiment

Figure 7:
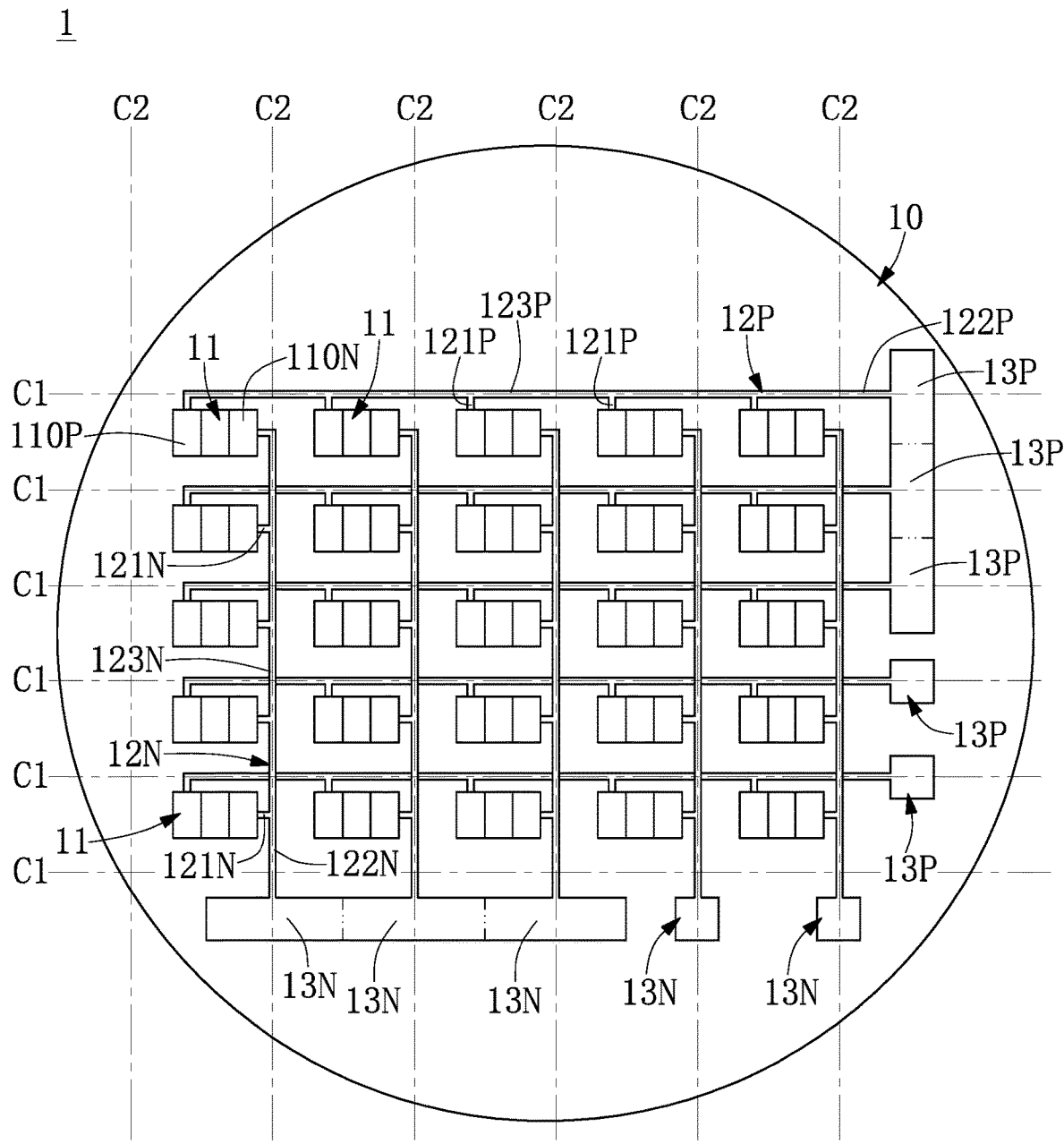
FIG. 7 is a top schematic view of an LED wafer according to a third embodiment of the present disclosure.
Figure 8:
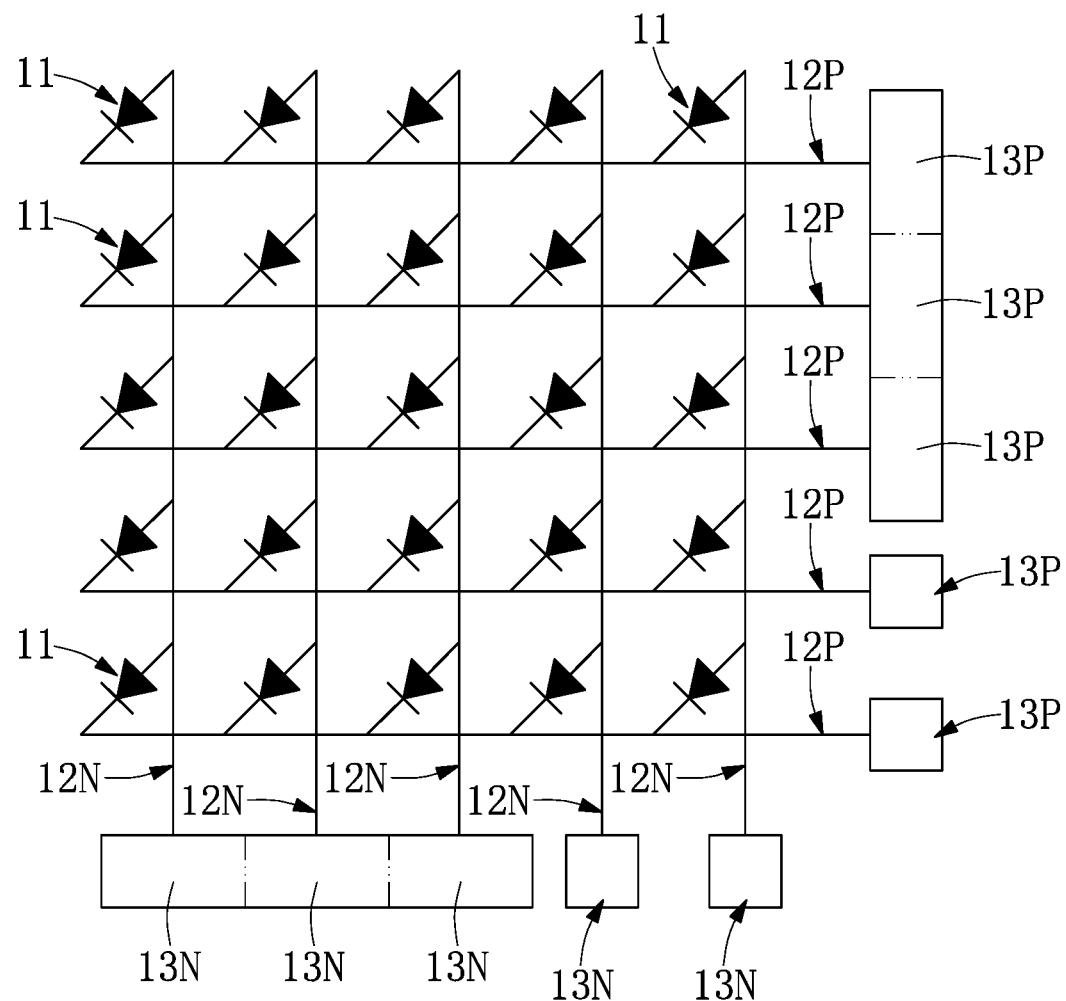
FIG. 8 is a schematic circuit diagram of the LED wafer according to the third embodiment of the present disclosure.

Referring to FIG. 7 to FIG. 8, a third embodiment of the present disclosure provides an LED wafer detection device, including an LED wafer 1 and a light-detecting module (not shown). Comparing FIG. 7 with FIG. 1 and FIG. 5, and comparing FIG. 8 with FIG. 2 and FIG. 6, the difference between the third embodiment and the first embodiment (or the second embodiment) is as follows: in the third embodiment, some of the positive test contacts 13P are separated from each other to respectively form a plurality of single positive test contacts that are adjacent to each other, and some of the negative test contacts 13N are separated from each other to respectively form a plurality of single negative test contacts that are adjacent to each other. In addition, the other positive test contacts 13P are connected with each other to form a single positive test area, and the other negative test contacts 13N are connected with each other to form a single negative test area. That is to say, the third embodiment can combine the first embodiment and the second embodiment, so that the third embodiment can not only detect each of some of the LED chips 11 of the LED wafer 1 by matching a single positive test contact (such as a positive test contact 13P) and a single negative test contact (such as a negative test contact 13N), but can also detect the other LED chips 11 of the LED wafer 1 by matching a single positive test area (such as the combination of the other positive test contacts 13P) and a single negative test area (such as the combination of the other negative test contact 13N).

In conclusion, by virtue of "all of the LED chips 11, the positive test circuit layers 12P, the negative test circuit layers 12N, the positive test contacts 13P and the negative test contacts 13N are disposed on the wafer base 10", "each LED chip 11 has a positive contact 110P and a negative contact 110N respectively electrically connected to the corresponding positive test circuit layer 12P and the corresponding negative test circuit layer 12N" and "the positive test contacts 13P are respectively electrically connected to the positive test circuit layers 12P, and the negative test contacts 13N are respectively electrically connected to the negative test circuit layers 12N", when inputting an electric current into the positive test contacts 13P, and then outputting the electric current from the negative test contacts 13N, each LED chip 11 can be excited to generate a light source L, and the light source L generated by each LED chip 11 can be optically detected by the light-detecting module 2.

Furthermore, by virtue of "providing an LED wafer 1 including a plurality of LED chips 11, a plurality of positive test circuit layers 12P, a plurality negative test circuit layers 12N, a plurality of positive test contacts 13P and a plurality of negative test contacts 13N" and "inputting an electric current into the positive test contacts 13P, and then outputting the electric current from the negative test contacts 13N so as to excite each LED chip 11 to generate a light source L", a light-detecting module 2 can be used to optically detect the light source L that is generated by each LED chip 11.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An LED wafer detection device, comprising:
an LED wafer including a wafer base, a plurality of LED chips, a plurality of positive test circuit layers, a plurality negative test circuit layers, a plurality of positive test contacts and a plurality of negative test contacts; and
a light-detecting module disposed above the LED wafer;
wherein the LED chips, the positive test circuit layers, the negative test circuit layers, the positive test contacts and the negative test contacts are disposed on the wafer base;
wherein each LED chip has a positive contact and a negative contact respectively electrically connected to the corresponding positive test circuit layer and the corresponding negative test circuit layer;
wherein the positive test contacts are respectively electrically connected to the positive test circuit layers, and the negative test contacts are respectively electrically connected to the negative test circuit layers;
wherein when inputting an electric current into the positive test contacts, and then outputting the electric current from the negative test contacts, each LED chip is excited to generate a light source, and the light source generated by each LED chip is optically detected by the light-detecting module;
wherein the LED chips, the positive test circuit layers and the negative test circuit layers respectively form a plurality of orthographic chip projections, a plurality of orthographic positive test circuit layer projections and a plurality of orthographic negative test circuit layer projections on the wafer base, the orthographic chip projections are disposed away from the orthographic positive test circuit layer projections and the orthographic negative test circuit layer projections.

2. The LED wafer detection device according to claim 1, wherein the positive test contacts are separated from each other to respectively form a plurality of single positive test contacts adjacent to each other, and the negative test contacts are separated from each other to respectively form a plurality of single negative test contacts adjacent to each other.

3. The LED wafer detection device according to claim 1, wherein the positive test contacts are connected with each other to form a single positive test area, and the negative test contacts are connected with each other to form a single negative test area.

4. The LED wafer detection device according to claim 1, wherein the positive test circuit layer and the negative test circuit layer are respectively disposed on a first horizontal plane and a second horizontal plane, the positive test contact and the negative test contact are respectively disposed on the first horizontal plane and the second horizontal plane, and the first horizontal plane is higher than, lower than or equal to the second horizontal plane; wherein the positive test circuit layer includes a plurality of first positive end portions, a second positive end portion, and a positive connection portion connected between the first positive end portion and the second positive end portion, the first positive end portion is electrically connected to the positive contact of the corresponding LED chip, the second positive end portion is electrically connected to the corresponding positive test contact, and the positive connection portion extends along a first cutting path; wherein the negative test circuit layer includes a plurality of first negative end portions, a second negative end portion, and a negative connection portion connected between the first negative end portion and the second negative end portion, the first negative end portion is electrically connected to the negative contact of the corresponding LED chip, the second negative end portion is electrically connected to the corresponding negative test contact, and the negative connection portion extends along a second cutting path.

5. An LED wafer, comprising:
a wafer base;
a plurality of LED chips disposed on the wafer base;
a plurality of positive test circuit layers disposed on the wafer base;
a plurality negative test circuit layers disposed on the wafer base;

a plurality of positive test contacts disposed on the wafer base; and a plurality of negative test contacts disposed on the wafer base;

wherein each LED chip has a positive contact and a negative contact respectively electrically connected to the corresponding positive test circuit layer and the corresponding negative test circuit layer;

wherein the positive test contacts are respectively electrically connected to the positive test circuit layers, and the negative test contacts are respectively electrically connected to the negative test circuit layers;

wherein when inputting an electric current into the positive test contacts, and then outputting the electric current from the negative test contacts, each LED chip is excited to generate a light source;

wherein the LED chips, the positive test circuit layers and the negative test circuit layers respectively form a plurality of orthographic chip projections, a plurality of orthographic positive test circuit layer projections and a plurality of orthographic negative test circuit layer projections on the wafer base, the orthographic chip projections are disposed away from the orthographic positive test circuit layer projections and the orthographic negative test circuit layer projections.

6. The LED wafer according to claim 5, wherein the positive test contacts are separated from each other to respectively form a plurality of single positive test contacts adjacent to each other, and the negative test contacts are separated from each other to respectively form a plurality of single negative test contacts adjacent to each other.

7. The LED wafer according to claim 5, wherein the positive test contacts are connected with each other to form a single positive test area, and the negative test contacts are connected with each other to form a single negative test area.

8. The LED wafer according to claim 5, wherein the positive test circuit layer and the negative test circuit layer are respectively disposed on a first horizontal plane and a second horizontal plane, the positive test contact and the negative test contact are respectively disposed on the first horizontal plane and the second horizontal plane, and the first horizontal plane is higher than, lower than or equal to the second horizontal plane; wherein the positive test circuit layer includes a plurality of first positive end portions, a second positive end portion, and a positive connection portion connected between the first positive end portion and the second positive end portion, the first positive end portion is electrically connected to the positive contact of the corresponding LED chip, the second positive end portion is electrically connected to the corresponding positive test contact, and the positive connection portion extends along a first cutting path; wherein the negative test circuit layer includes a plurality of first negative end portions, a second negative end portion, and a negative connection portion connected between the first negative end portion and the second negative end portion, the first negative end portion is electrically connected to the negative contact of the corresponding LED chip, the second negative end portion is electrically connected to the corresponding negative test contact, and the negative connection portion extends along a second cutting path.

9. An LED wafer detection method, comprising:

providing an LED wafer including a wafer base, a plurality of LED chips, a plurality of positive test circuit layers, a plurality negative test circuit layers, a plurality of positive test contacts and a plurality of negative test contacts, wherein the LED chips, the positive test circuit layers and the negative test circuit layers respectively form a plurality of orthographic chip projections, a plurality of orthographic positive test circuit layer projections and a plurality of orthographic negative test circuit layer projections on the wafer base, the orthographic chip projections are disposed away from the orthographic positive test circuit layer projections and the orthographic negative test circuit layer projections;

inputting an electric current into the positive test contacts, and then outputting the electric current from the negative test contacts so as to excite each LED chip to generate a light source; and using a light-detecting module to optically detect the light source that is generated by each LED chip.

10. The LED wafer detection method according to claim 9, wherein the LED chips, the positive test circuit layers, the negative test circuit layers, the positive test contacts and the negative test contacts are disposed on the wafer base; wherein each LED chip has a positive contact and a negative contact respectively electrically connected to the corresponding positive test circuit layer and the corresponding negative test circuit layer; wherein the positive test contacts are respectively electrically connected to the positive test circuit layers, and the negative test contacts are respectively electrically connected to the negative test circuit layers; wherein the positive test circuit layer and the negative test circuit layer are respectively disposed on a first horizontal plane and a second horizontal plane, the positive test contact and the negative test contact are respectively disposed on the first horizontal plane and the second horizontal plane, and the first horizontal plane is higher than, lower than or equal to the second horizontal plane; wherein the positive test circuit layer includes a plurality of first positive end portions, a second positive end portion, and a positive connection portion connected between the first positive end portion and the second positive end portion, the first positive end portion is electrically connected to the positive contact of the corresponding LED chip, the second positive end portion is electrically connected to the corresponding positive test contact, and the positive connection portion extends along a first cutting path; wherein the negative test circuit layer includes a plurality of first negative end portions, a second negative end portion, and a negative connection portion connected between the first negative end portion and the second negative end portion, the first negative end portion is electrically connected to the negative contact of the corresponding LED chip, the second negative end portion is electrically connected to the corresponding negative test contact, and the negative connection portion extends along a second cutting path.

* * * * *